US009157147B2

(12) United States Patent
Scherer

(10) Patent No.: US 9,157,147 B2
(45) Date of Patent: Oct. 13, 2015

(54) TEST GLASS CHANGING SYSTEM

(75) Inventor: Michael Scherer, Kahl (DE)

(73) Assignee: LEYBOLD OPTICS GMBH (DE)

( * ) Notice: Subject to any disclaimer, the term of this patent is extended or adjusted under 35 U.S.C. 154(b) by 238 days.

(21) Appl. No.: 13/127,520

(22) PCT Filed: Nov. 5, 2009

(86) PCT No.: PCT/EP2009/007938
§ 371 (c)(1),
(2), (4) Date: Jul. 25, 2011

(87) PCT Pub. No.: WO2010/052000
PCT Pub. Date: May 14, 2010

(65) Prior Publication Data
US 2011/0265583 A1    Nov. 3, 2011

(30) Foreign Application Priority Data
Nov. 6, 2008  (DE) .......................... 10 2008 056 125

(51) Int. Cl.
*G01B 11/06* (2006.01)
*C23C 14/54* (2006.01)
*C23C 14/56* (2006.01)
*C23C 14/04* (2006.01)
*C23C 14/50* (2006.01)

(52) U.S. Cl.
CPC ............ *C23C 14/547* (2013.01); *C23C 14/042* (2013.01); *C23C 14/50* (2013.01); *C23C 14/56* (2013.01); *C23C 14/566* (2013.01); *G01B 11/0616* (2013.01); *G01B 11/0683* (2013.01)

(58) Field of Classification Search
None
See application file for complete search history.

(56) References Cited

U.S. PATENT DOCUMENTS 3,698,946 A * 10/1972 Kaspaul .................... 118/665
4,828,391 A * 5/1989 Zultzke et al. ............. 356/632
4,878,755 A * 11/1989 Siegmund et al. .......... 356/632
(Continued)

FOREIGN PATENT DOCUMENTS

DE        202897 A1    10/1983
DE       3604624 A1     8/1987
(Continued)

OTHER PUBLICATIONS

International Search Report PCT/EP2009/007938; Dated Feb. 17, 2010.
(Continued)

*Primary Examiner* — Dah-Wei D Yuan
*Assistant Examiner* — Binu Thomas
(74) *Attorney, Agent, or Firm* — Cantor Colburn LLP

(57) ABSTRACT

The invention relates to a test glass changing system (10) for selectively coating and optically measuring a test glass (24, 24") in a coating chamber (1) of a vacuum coating installation (3). In the coating chamber, a movable turntable (2) is used to guide substrates (7) on a path through a stream of a coating material. The test glass changing system (10) comprises a test glass holder (8, 8") with a test glass plate (26) for holding the test glass (24, 24"), and a cover (28, 28") for selectively covering the test glass plate (26). The test glass changing system (10) also comprises a rotary apparatus (34) for rotating the test glass plate (26) about an axis (51) which is oriented approximately parallel to the axis of rotation (5) of the turntable (2). The test glass holder (8, 8") can be positioned on the turntable (2) and removed from the coating chamber (1) in the form of a unit.

10 Claims, 4 Drawing Sheets

(56) References Cited

U.S. PATENT DOCUMENTS

| | | | |
|---|---|---|---|
| 5,190,590 A * | 3/1993 | Suzuki et al. | 118/664 |
| 5,911,856 A * | 6/1999 | Suzuki et al. | 204/192.13 |
| 6,241,824 B1 | 6/2001 | Brauer et al. | |
| 6,879,744 B2 * | 4/2005 | Atanasov | 356/630 |
| 2003/0147084 A1 * | 8/2003 | Wirth | 356/504 |
| 2005/0199185 A1 | 9/2005 | Richert et al. | |

FOREIGN PATENT DOCUMENTS

| | | |
|---|---|---|
| DE | 10204075 A1 | 8/2003 |
| EP | 1746182 A2 | 1/2007 |
| JP | 53-67684 A | 6/1978 |

OTHER PUBLICATIONS

Herrmann R, et al. "Automated control of optical layer fabrication processes" Proceedings of the SPIE—The International Society for Optical Engineering, SPIE, US, vol. 401, Apr. 20, 1983, pp. 83-92, XP008118251.

Japanese Office Action issued Nov. 25, 2013; re: Japanese Patent Application No. 2011-535044; citing: JP 62-192605, JP 2000-054131, JP 2005-320622, JP 53-067684 and JP 2007-023380 and US 5,911,856.

* cited by examiner

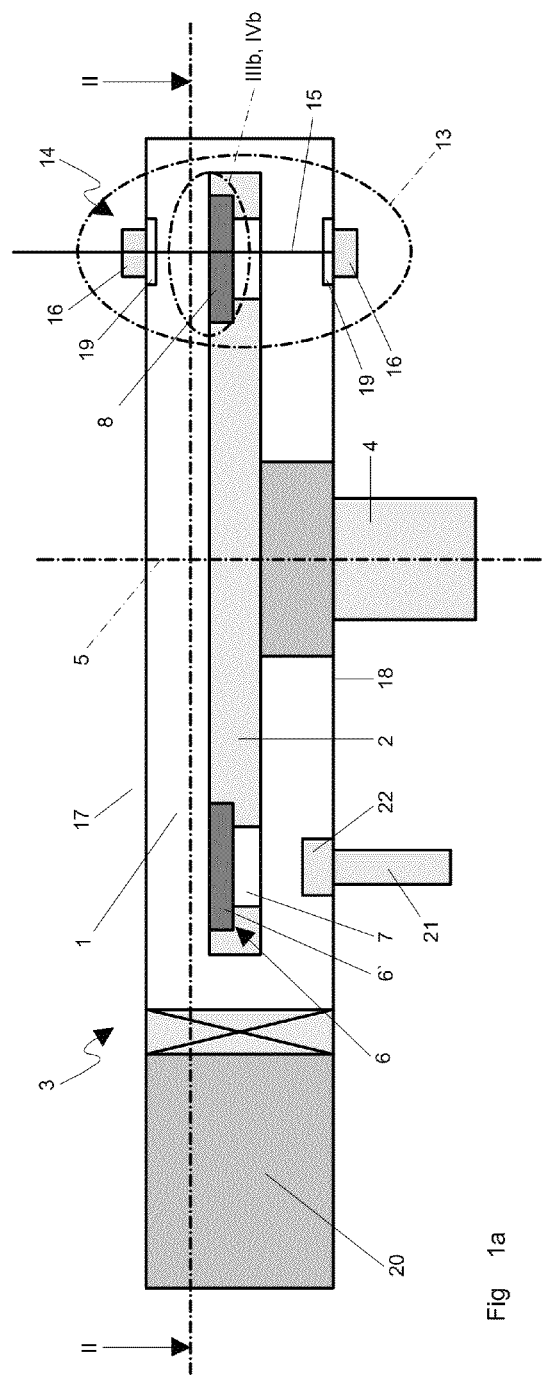
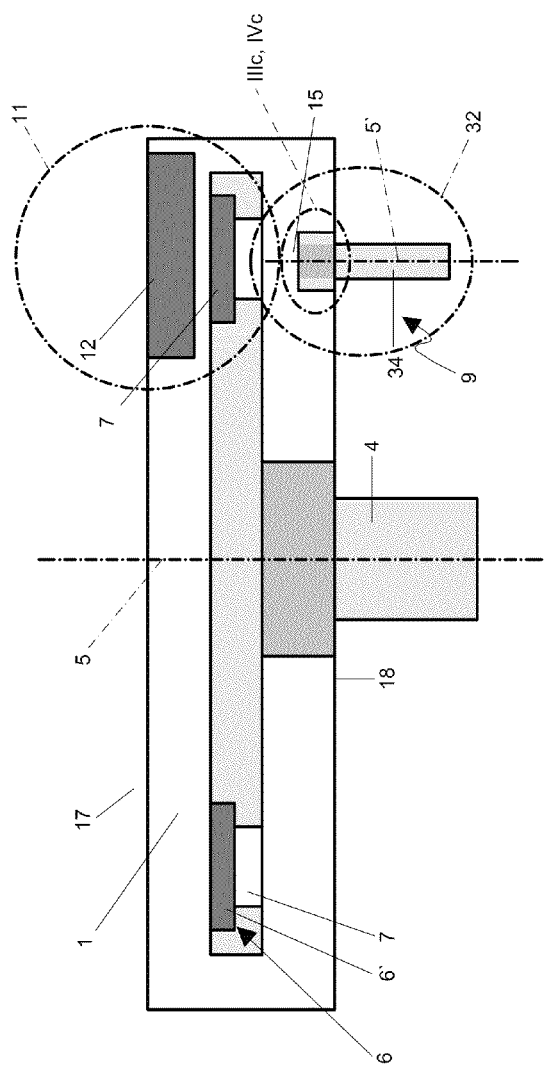

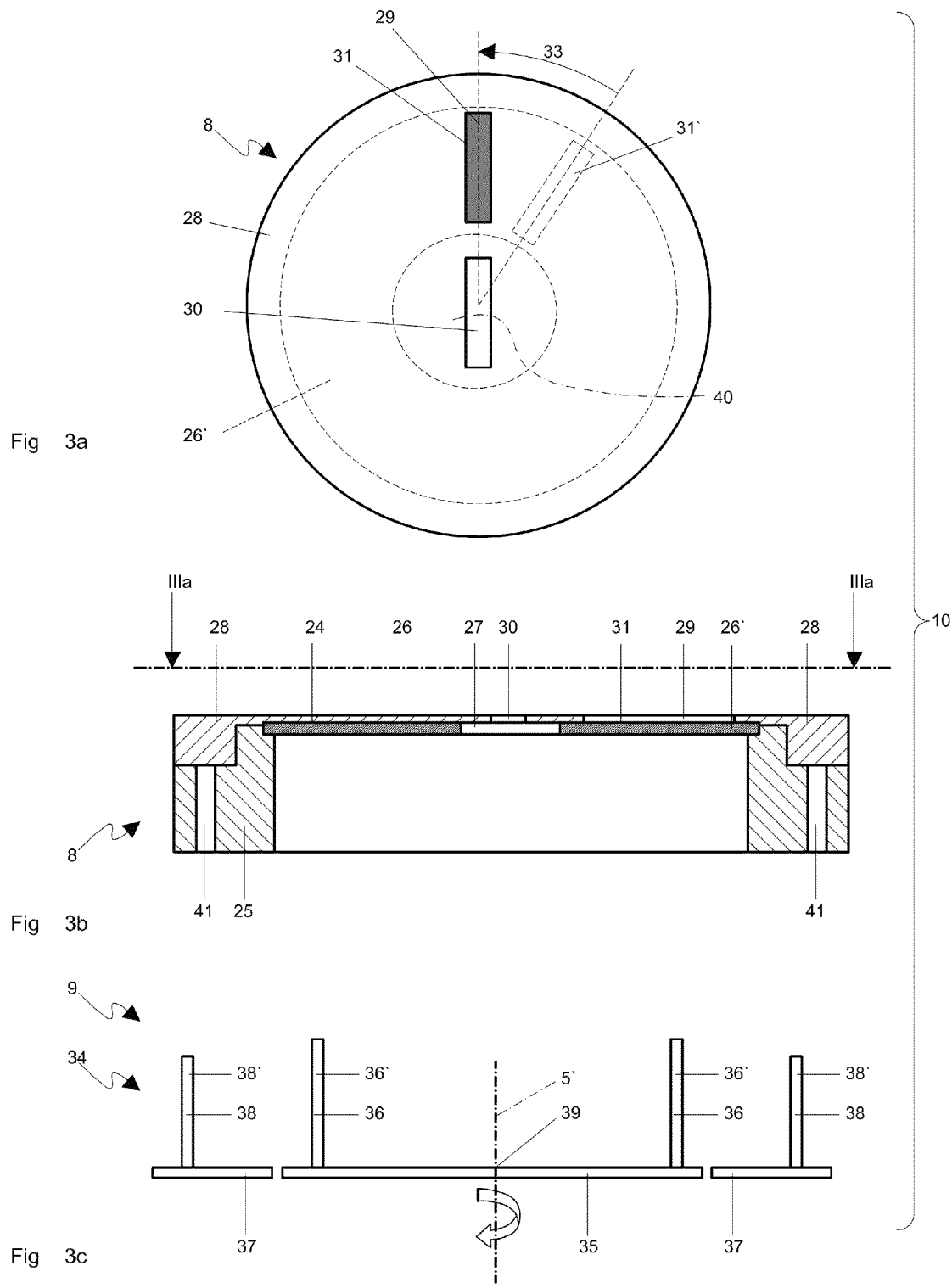

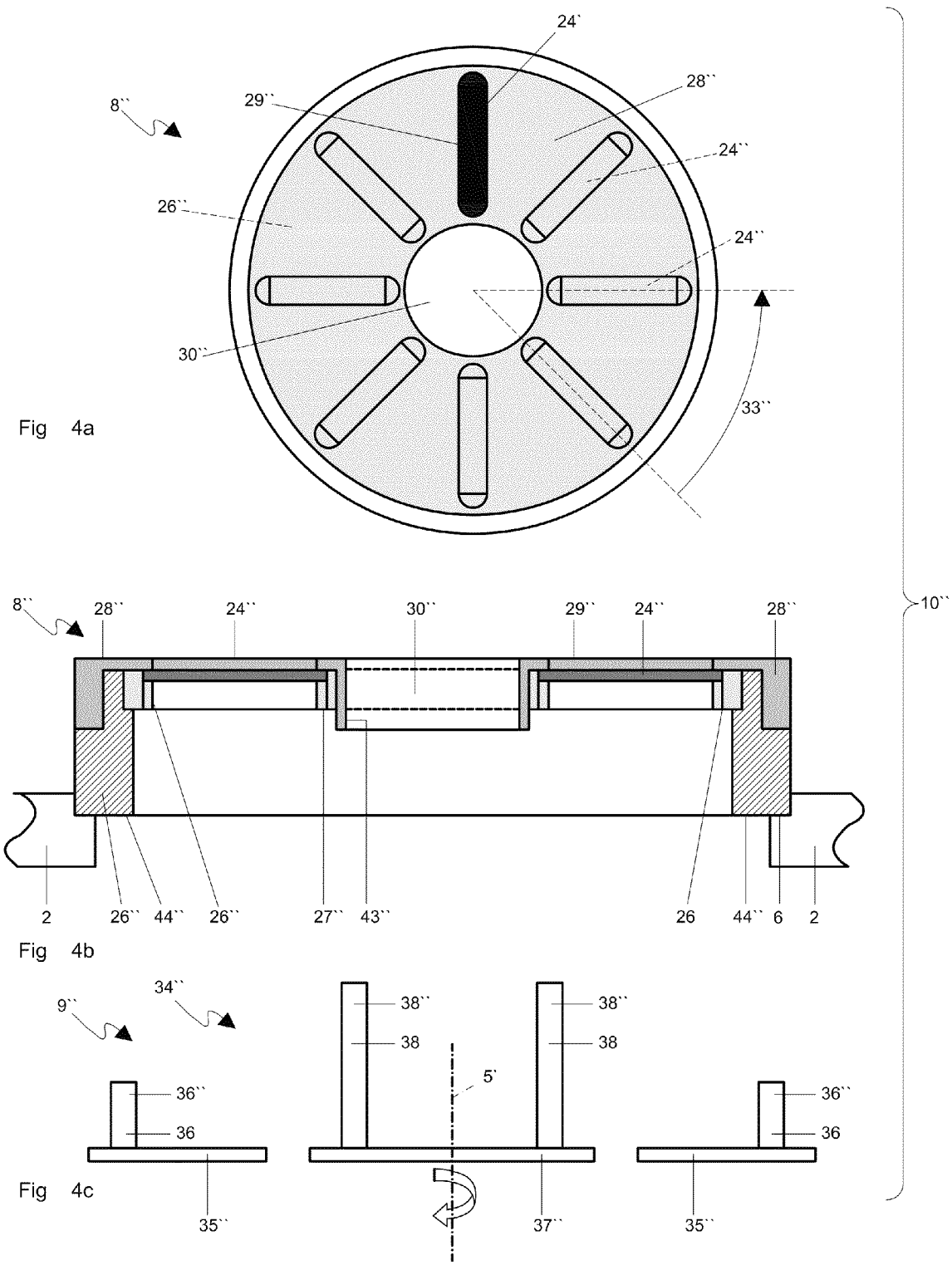

TEST GLASS CHANGING SYSTEM

TECHNICAL FIELD

The invention relates to a test glass changing system for selectively coating and optically measuring a test glass plate in a vacuum coating installation.

BACKGROUND

The production of optical multilayer systems, which are also referred to as interference layers, plays an important role in, for example, optical products such as band-pass filters, edge filters, cold mirrors, beam splitters, and antireflection coatings. The goal of such a coating is to achieve transmission or reflection at the multilayer system that is as complete as possible within a prescribed wavelength range but achieve negligible transmission or reflection in the wavelength ranges outside thereof, with the smallest transition region possible. Meeting these demands requires a large number of individual layers, wherein, for example, layers with high and low refractive index are alternately applied to the substrate; however, it is also possible for two layers with a high refractive index or two layers with a low refractive index to follow one another directly.

When producing such complex layer systems, more particularly when producing multilayers with specific functional properties, a regular measurement or check of the functional layers applied to the substrates is necessary in order to ensure the desired layer thicknesses and layer properties. To this end, use is made of test glasses, on which in each case a single layer is deposited and checked. In the case of complex optical filters, a plurality of test glass changes are required in order to achieve the filter specifications. In order to achieve the required accuracy, the test glass must be arranged on the site of the substrates and substantially experience the same coating as the substrate; furthermore the test glass change between the individual coating sequences should be as automated as possible, i.e. without manual replacement of the test glasses by an operator.

DE 36 04 624 A1 has disclosed a test glass changer that allows a test glass change when the coating chamber is sealed. A holder for holding a plurality of test glasses is mounted on a rotary disk, which is used to guide the substrates along a path through at least one coating material flow. The holder is moved with the rotary disk and is mounted such that it can rotate with respect to the rotary disk. An intermittent motion system, which is arranged along the path of the rotary disk, switches respectively one test glass into a position that is stationary with respect to the rotary disk, in which position said test glass, along with the substrates, is alternately guided through the beam path of the measurement device and the coating material flow for a prescribable number of revolutions of the rotary disk. The holder is covered by a cover, which is attached to the rotary disk in a stationary fashion and in each case only exposes a single test glass in its coating and measurement position. The holder is rotated by a moveable shift finger, which is arranged in the interior of the coating chamber and protrudes into the orbit of the rotary disk and interacts with projections on the holder. When the shift finger engages into a projection on the holder, a test glass is rotated out of its congruent position with the measurement window and the next test glass takes its place. Hence, the test glass changer in DE 36 04 624 A1 permits a test glass change with a sealed coating chamber. However, loading the test glass changer is very complicated because the individual test glasses must be inserted into the holder of the test glass changer through the substrate lock. Furthermore, the test glass changer shown in DE 36 04 624 A1 can only hold a comparatively small number (four) of test glasses, and so (at least) one manual replacement of the test glasses is necessary when producing a multilayer system.

BRIEF SUMMARY

The invention further develops the known prior art such that a larger number of test glasses are provided, which can be changed in the interior of the coating chamber without manual intervention. Furthermore, it should be possible to insert the test glasses into the coating chamber as simply as possible.

According to this, the test glass changing system comprises a test glass holder with a test glass plate for holding one or more test glasses and a cover, which covers the test glass plate and protects the test glasses held therein from being coated. The cover is provided with a measurement window, which only exposes a small region of the test glass plate to being coated. Provision can also be made for a plurality of measurement windows and/or reference windows. The test glass plate can be rotated with respect to the cover by means of a rotation device, which forms a part of the test glass changing system; this moves different test glasses attached to the test glass plate into the region of the measurement window, where they are coated and measured. Compared to the generic DE 36 04 624 A1, the test glass changing system according to the invention differs in that the test glass holder (with the test glass plate and the cover) forms a closed unit that—like the substrates to be coated—can be introduced into the coating chamber through the substrate lock and can be positioned on the rotary disk. This allows a particularly simple and time-saving loading of the rotary disk: instead of equipping the test glass changing system (which is fixedly connected to the rotary disk) with test glasses, as necessary in DE 36 04 624 A1, which test glasses must be introduced individually though the substrate lock and have to be positioned on the test glass plate there, use of the test glass changing system according to the invention allows the equipping and preparation of the test glass holder to be carried out outside of the coating chamber and temporally independently of the substrate change. This is advantageous from an ergonomic point of view and saves time. Furthermore, it is possible to arrange a comparatively large number of test glasses on the test glass holder.

The cover of the test glass holder is embodied such that it can be rotated and lifted with respect to the test glass plate. A test glass change within the coating chamber is carried out in such a manner that the cover of the test glass holder is lifted, the test glass plate is rotated with respect to the cover by a prescribed angle, and the cover is subsequently put back down again. The rotation device used to rotate the test glass plate is preferably embodied as a lift/rotation device, with the aid of which it is possible to carry out rotations around an axis parallel to the rotational axis of the rotary disk and lift movements in the direction of this axis. A test glass change is then carried out such that the test glass plate is lifted off the rotary disk (or a base body of the test glass holder resting on the rotary disk) in the axial direction and the cover is lifted off the test glass plate in the axial direction; these two lift motions can be carried out at the same time or with a time offset with respect to one another. The test glass plate is subsequently rotated, as a result of which the region of the test glass plate situated under the measurement window of the cover is replaced and a new region of the test glass plate comes to rest below the measurement window of the cover. Test glass plate and cover are put down in this new relative angular position.

If the test glass holder is now moved on the rotary disk through the coating station of the coating chamber, the region of the test glass plate just rotated to be under the measurement window is coated.

For the purpose of the test glass change in the case of circular or cylindrical test glass plates, the lift/rotation device expediently has two concentric annular bodies, which can both (preferably together) be adjusted in terms of their height; one of the two annular bodies can be rotated in a controlled fashion. The rotatable annular body serves for lifting and rotating the test glass plate, while the other annular body serves to lift the cover.

The lift/rotation device can be arranged in a stationary fashion in the processing chamber and can for example be located in the region of the coating station. In this case, a test glass change can only take place in a prescribed rotational position of the rotary disk, to be precise when the test glass holder is exactly above the lift/rotation device. Alternatively, the test glass rotation device can be arranged on the rotary disk (or on a revolving stage rotating in synch with the rotary disk); the advantage of this is that the test glass change can take place without changing the speed of the rotary disk and at any position in the coating chamber (for example during the transport of the test glass holder between measurement station and coating station).

In a first embodiment of the invention, the test glass plate is a circular-disk-shaped monitor glass. In this embodiment, the entire test glass plate or any selected region of the test glass plate can serve as test glass. The monitor glass is advantageously provided with a central cutout, through which a reference beam can be routed during the optical measurement in order to monitor a drift of the measurement light.

In a second embodiment of the invention, the test glass plate is provided with a multiplicity of holding regions for holding individual test glasses. In this case, the test glass plate is rotated by a prescribed angle with respect to the cover during a test glass change so that the test glass comes to rest directly below the measurement window of the cover.

BRIEF DESCRIPTION OF THE DRAWINGS

In the following text, the invention will be explained in more detail on the basis of an exemplary embodiment illustrated in the figures, in which:

FIGS. 1a, 1b show sectional views of a coating installation with a rotary disk;

FIG. 3 shows a test glass changing system according to the invention with a test glass holder and a lift/rotation device in a first embodiment:

FIG. 3a shows a plan view of the test glass holder;

FIG. 3b shows a sectional view of the test glass holder;

FIG. 3c shows a sectional view of the associated lift/rotation device;

FIG. 4 shows a test glass changing system according to the invention with a test glass holder and a lift/rotation device in a further embodiment:

FIG. 4a shows a plan view of the test glass holder;

FIG. 4b shows a sectional view of the test glass holder; and

FIG. 4c shows a sectional view of the associated lift/rotation device.

DETAILED DESCRIPTION

Figure 2:
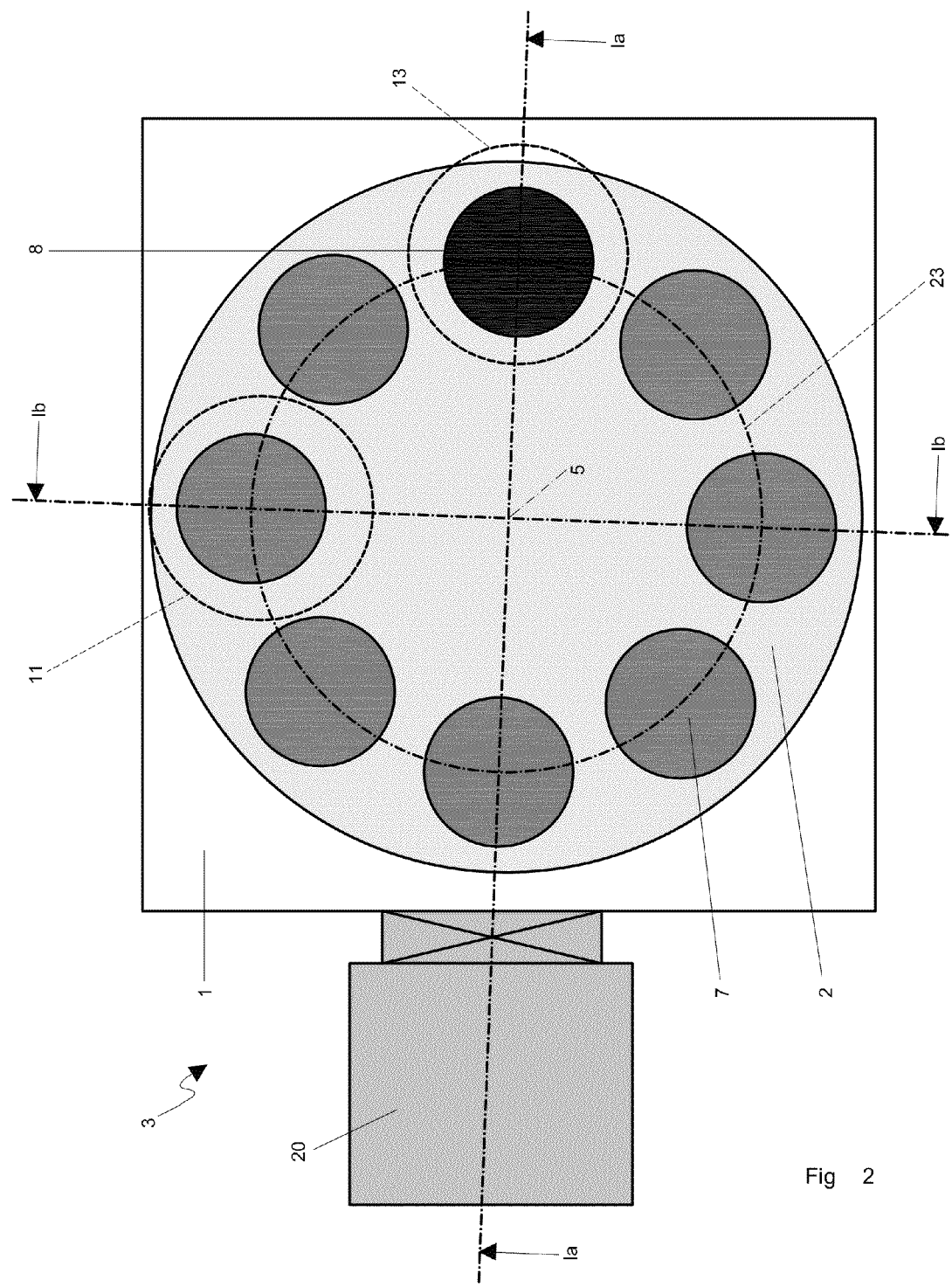
FIG. 2 shows a schematic plan view of the rotary disk in FIGS. 1a and 1b.

FIGS. 1a and 1b show schematic sectional views through a coating chamber 1, which forms part of a vacuum coating installation 3. Within the coating chamber 1 there is a rotary disk 2, which can be rotated around a rotational axis 5 with the aid of a rotation apparatus 4 that can be subject to open-loop or closed-loop control. A plan view of the rotary disk 2 is illustrated in FIG. 2. A plurality of recesses 6 are provided on the rotary disk 2, which recesses are arranged on a common great circle 23 around the axis 5. The recesses 6 can selectively be equipped with a disk-shaped substrate 7 or with a test glass holder 8; an oxide layer is deposited under residual gas on these substrates 7 and on the test glass holder 8 in the coating chamber 1. Together with a test glass rotation device 9, the test glass holder 8 forms part of a test glass changing system 10.

The rotary disk 2 is equipped with substrates 7 or test glass holder 8 through a substrate lock 20 in a side wall of the coating chamber 1. In order to remove the substrates 7 or test glass holder 8, a lift device 21 with a stamp 22 that can be displaced in the axial direction 5 is arranged in the coating chamber 1, directly opposite the substrate lock 20. During a substrate change, the stamp 22 of the lifting device 21 is guided from below through an aperture 6' in the region of the recess 6 of the rotary disk 2 and in the process lifts the substrate disk 7 or test glass holder 8 situated in the region of the recess 6 out of the rotary disk 2, and so the substrate disk 7 or test glass holder 8 can be removed via the substrate lock 20. The substrate lock 20 can easily be used to replace a second, etc. test glass holder 8 and hence a sufficient number of monitor glasses can be provided, even in the case of a very large number of layers, without breaking the vacuum or losing much space to test glass holders.

The coating chamber 1 comprises a coating station 11 and a measurement station 13, which are preferably delimited from one another by diaphragms, and are only interconnected through slits in the diaphragms. In the coating station 11 there is a sputtering apparatus 12, in which—in a known fashion—sputtering material of a target is sputtered by reactive sputtering, with a sputtering material/oxygen compound precipitating onto the walls of the coating chamber 1 and on the substrates 7 and the test glass holder 8.—In the measurement station 13 there is an optical measurement apparatus 14, by means of which optical properties, more particularly transmission and/or reflection, of the growing layers can be determined. The optical measurement apparatus 14 comprises a measurement light source arranged above the coating chamber 1 and detectors 16, arranged below and/or above the coating chamber 1, for measuring the transmitted and/or reflected radiation. Windows 19 have been inserted in the top 17 and/or the base 18 of the coating chamber 1 in a vacuum-tight fashion and the measurement light beam 15 is guided through the coating chamber 1 via said windows. The optical measurement apparatus 14 is preferably a single wavelength or multi-wavelength spectrometer, more particularly a spectral photometer or a spectral ellipsometer. With the aid of the optical measurement apparatus 14, it is possible to measure the optical losses after deposition of a prescribed layer thickness and set layer properties depending on a signal from the optical measurement apparatus 14. If use is made of a spectral photometer, it is easily possible to establish transmission, absorption, and reflection in a prescribed spectral range and as a function of the layer thickness.

In addition to the coating station 11 shown in FIG. 1, provision can be made for further processing regions (e.g. plasma processing regions, further sputtering apparatuses, etc.) in the coating chamber 1. Furthermore, provision can be made for further measurement stations.

The rotary disk 2 in the coating chamber 1 is rotated around the rotational axis 5 in a controlled or regulated fashion with the aid of the rotation apparatus 4. In the process, the substrates 7 and the test glass holder 8 are successively moved at least once through the coating station 11 and the measurement station 13 on a circular orbit. As indicated in FIG. 2, the test glass holder 8 has approximately the same diameter as the substrate disks 7, and so the test glass holder 8—like the substrate disks 7—can be held in any recess 6 in the rotary disk 2 and can be removed from the rotary disk 2 using the lifting device 21.

In order to monitor the coating applied to the substrates 7 regularly, the measurement apparatus 13 is used to carry out measurements on test glasses 24 that are held in the test glass holder 8. FIGS. 3a and 3b show a plan view (FIG. 3a) and a sectional view (FIG. 3b) of the test glass holder 8 from FIG. 1. The test glass holder 8 comprises a tubular basic body 25, on which there is a circular-disk-shaped test glass plate 26. The test glass plate 26 has a central cutout 27. In the exemplary embodiment shown in FIGS. 3a and 3b, the test glass plate 26 is embodied as a monitor glass 26', i.e. as a continuous disk-shaped glass plate with a central cutout 27. In order to achieve a targeted coating of selected regions of the monitor glass 26', the monitor glass 26' is covered by a removable circular cover 28. The cover 28 is provided with two openings, a measurement window 29 and a reference window 30. If the test glass holder 8 is moved on the rotary disk 2 though the coating station 11, the region 31 of the monitor glass 26' situated below the measurement window 29 is coated, while the remaining regions of the monitor glass 26', which are covered by the cover 28, remain uncoated.

The measurement window 29 serves for the optical measurement in the measurement station 13 of the layer thickness or the layer properties of the region 31 of the monitor glass 26' situated in this window 29. The reference window 30, arranged in the center of the cover 28, serves for the 100% measurement of the layers applied to the monitor glass 26', as a result of which a drift of the measurement light is avoided. In the exemplary embodiment in FIG. 3, the two windows 29, 30 have a rectangular shape; however, they can also be circular, elliptical, etc. If the test glass holder 8 is brought into the coating station 11, the region 31 of the monitor glass 26' situated below the measurement window 29 is exposed to the sputtering medium and is coated; the thickness and composition of this coating is established in the measurement station 13. In a changer station 32, the monitor glass 26' located in the test glass holder 8 is rotated through a prescribed angle 33 in order to place a further (previously uncoated) region 31' of the monitor glass 26' below the measurement window 29. This rotation of the monitor glass 26' is brought about with the aid of the rotation device 9, which is arranged in the changer station 32, which is preferably embodied as a lift/rotation device 34 and—as shown in FIG. 1b—attached to the base 18 of the coating chamber 1 below the rotary disk 2. In the exemplary embodiment in FIG. 1b, the changer station 32 is situated in the same region of the coating chamber 1 as the coating station 11, and so the lift/rotation device 34 is arranged below the sputtering apparatus 12.

The lift/rotation device 34 comprises two concentrically arranged annular bodies 35, 37 (see FIG. 3c) and is arranged in such a position in the coating chamber 1 that the common center 39 of the annular bodies 35, 37 is situated directly below the great circle 23 of the substrate disks 7 mounted on the rotary disk 2. The inner annular body 35 can be rotated around an axis 5' with the aid of a control apparatus (not illustrated in the figures), which axis runs through the center 39 of said annular body and is aligned approximately parallel to the rotational axis 5 of the rotary disk 2. Furthermore, the annular bodies 35, 37 can together be displaced parallel to the axis 5' with the aid of the control apparatus. The lift/rotation device can also be embodied such that the two annular bodies 35, 37 can be displaced individually, however this requires an additional movement axis; therefore it is more advantageous to provide a common advance movement of the two annular bodies 35, 37.

Each annular body 35, 37 is provided with a set of lifting elements 36, 38 (pins 36', 38' in the present exemplary embodiment), which protrude from the annular bodies 35, 37 in the displacement direction 5'. If a test glass change should be carried out (i.e. if the monitor glass 26' in the test glass holder 8 should be rotated by an angle 33), the test glass holder 8 is, with the aid of the rotary disk 2, positioned with respect to the lift/rotation device 34 such that the center 40 of the test glass holder 8 comes to rest above the center 39 of the annular bodies 35, 37. Then the two annular bodies 35, 37 are moved upward until the pins 38' of the outer annular body 37 penetrate into the cavities 41 in the base body 25 of the test glass holder 8, while the pins 36' of the inner annular body 35 are held in the interior 42 of the base body 41. The lengths of the pins 36', 38' are calculated such that if the annular bodies 35, 37 are advanced further, the pins 38' of the outer annular body 37 lift the cover 28 of the test glass holder 8 while the pins 36' of the inner annular body 35 lift the monitor glass 26', to be precise such that the monitor glass 26' is lifted off the base body 25 while the cover 28 is lifted off the monitor glass 26' such that monitor glass 26' and cover 28 rest on the pins 36' and 38' without touching one another—and without touching the base body 25. In this position the monitor glass 26' is rotated through the angle 33 by a rotation of the inner annular body 35, while base body 25 and cover 28 remain in their positions. As a result of this, another region 31' of the monitor glass 26' now comes to rest under the measurement window 29 instead of the monitor glass region 31 originally situated below the measurement window 29. Thus, this rotation of the monitor glass 26' so to speak carries out a "test glass change": successive rotations of the monitor glass 26' with respect to the cover 28 afford the possibility of moving different regions 31, 31' of the monitor glass 26' into the region of the measurement window 29. The lift/rotation device 34 therefore allows a fully automatic test glass change within the sealed coating chamber 1.

The size and position of the measurement window 29 is calculated such that the monitor glass 26' can be moved into at least six different measurement positions, advantageously eight (or even more) different measurement positions by rotation. In the exemplary embodiment in FIGS. 3a and 3b, the monitor glass 26' has a diameter of 125 mm, while the measurement window 29 has a dimension of 38 mm×15 mm.

A coating sequence is brought about as follows: at first, the substrates 7 and a test glass holder 8, which contains an uncoated monitor glass 26', are instated in the coating chamber 1 through the substrate lock 20 and placed into the positions 6 of the rotary disk 2 provided therefor. In a first coating sequence, the substrates 7 and the region 31 of the monitor glass 26' lying below the measurement window 29 are subjected to a first coating in the sputtering apparatus 12; the changing intensity of transmission and/or reflection is measured in situ in the measurement station 13 during the coating and hence the thickness and composition of the layer deposited in the region 31 of the monitor glass 26' is determined optically. After this first coating process, which comprises the deposition of at least one layer but in general comprises the deposition of a multiplicity of layers, the test glass holder 8 is positioned with respect to the lift/rotation device 34 and—as described above—a test glass change is performed by rotating the monitor glass 26' such that now a new region 31' of the monitor glass 26' lies below the measurement window 29 instead of the region 31. A second coating sequence is subsequently carried out with a second in situ measurement. This is repeated up to the last coating sequence. If the number of desired coating sequences is larger than the number of coating regions 31, 31' that can be placed on the monitor glass 26', the test glass holder 8 can be replaced by a new uncoated test glass holder through the substrate lock 20.

FIGS. 4a-4c show a further embodiment of the test glass changing system according to the invention. This test glass changing system 10" comprises a test glass holder 8", the test glass plate 26 of which is formed by a support plate 26" that has cutouts for individual measurement glasses 24', 24". In the present exemplary embodiment, the measurement glasses 24', 24" are formed by elongate glass platelets 24" that are rounded off at the ends, have a length of 40 mm, and a width of 16 mm, which glass platelets are arranged symmetrically on the support plate 26"; in the exemplary embodiment shown in FIG. 4b, the support plate 26" can hold eight measurement glasses 24", which are each rotated by an angle 33" of 45° with respect to the adjacent measurement glass. In the center, the support plate 26" has a cutout 27". In order to bring about a targeted coating of a selected measurement glass 24', the support plate 26" is covered by a removable circular cover 28". It is possible to identify in the plan view of FIG. 4b that the cover 28" has a measurement window 29" (to allow access to a selected measurement glass 24') and a reference window 30" (for the reference measurement during the optical measurement in the measurement station 13). If the test glass holder 8" is moved through the coating station 11 on the rotary disk 2, the measurement glass 24' situated below the measurement window 29" is coated while the further measurement glasses 24" covered by the cover 28" remain uncoated. The thickness and composition of this coating is established in the measurement station 13. In the changer station 32, the support plate 26" of the test glass holder 8 is rotated by a prescribed angle 33" in order to place a further measurement glass 24" below the measurement window 29" in the cover 28". This rotation of the support plate 26" is brought about with the aid of the rotation device 9", embodied as a lift/rotation device 34", which is attached to the base 18 of the coating chamber 1 and comprises two concentrically arranged annular bodies 35", 37" (see FIG. 4c). The center 39" of the annular bodies 35", 37" is situated directly below the great circle 23 of the substrate disks 7 mounted on the rotary disk 2. The outer annular body 35" can be rotated around the axis 5' in a controlled fashion, while the annular bodies 35", 37" can together be displaced parallel to the axis 5'. Each annular body 35", 37" is provided with lifting elements 36, 38 in the form of an annular web 36", 38" protruding upward. The two annular bodies 35", 37" are moved upward during a test glass change, with the web 38" of the inner annular body 37" meeting a downwardly protruding tube section 43" of the cover 28" and pressing the cover 28" upward, while the web 36" of the outer annular body 35" meets the lower edge 44" of the support plate 26" and lifts the support plate 26". Here, the lengths of the webs 36", 38" are calculated such that during the common advance of the annular bodies 35", 37", the support plate 26" is lifted off the rotary disk 2 while the cover 28" is lifted off the support plate 26" such that support plate 26" and cover 28" rest on the webs 36" and 38" without touching one another—and without touching the rotary disk 2. In this position, the support plate 26" is rotated by the angle 33" by a rotation of the outer annular body 35" while the cover 28" held on the annular body 38" remains in its position, and so another test glass 24" now comes to rest under the measurement window 29" instead of the test glass 24' originally situated below the measurement window 29". Hence, different test glasses 24', 24" can be moved into the region of the measurement window 29" by successive rotations of the support plate 26" with respect to the cover 28". The lift/rotation device 34" thus allows a fully automatic test glass change within the sealed coating chamber 1.

The invention claimed is:

1. A test glass changing system for selectively coating and optically measuring a test glass in a coating chamber of a vacuum coating installation, in which a moveable rotary disk is arranged for guiding at least one substrate on a path through a coating material flow, the test glass changing system comprising:
    a test glass holder having a test glass plate for holding the test glass and a cover for selectively covering the test glass plate,
    and a rotation device for rotating the test glass plate around an axis, which is
    aligned approximately parallel to a rotational axis of the rotary disk,
    wherein the test glass holder is removable and includes the test glass plate and the cover forming a unit positioned on the rotary disk as a unit, such that the test glass holder is removed from the rotary disk and the coating chamber as a unit, a plurality of recesses disposed on the rotary disk and arranged on a common great circle around the rotational axis, wherein the recesses receive the at least one substrate or the test glass holder, and
    a stamp of a lifting device arranged in the coating chamber is disposed beneath one of the plurality of recesses and displaced in an axial direction during a substrate change such that the stamp is configured to lift the substrate or the test glass holder disposed in the recess out of the rotary disk.

2. The test glass changing system as claimed in claim 1, wherein the test glass plate is formed by a circular-disk-shaped monitor glass.

3. The test glass changing system as claimed in claim 2, wherein the monitor glass has a central cutout.

4. The test glass changing system as claimed in claim 1, wherein the test glass plate is embodied as a support plate for holding a multiplicity of test glasses.

5. The test glass changing system as claimed in claim 1, wherein the test glass rotation device is embodied as a lift/rotation device, with the aid of which
    the test glass plate is displaced with respect to the rotary disk in an axial direction,
    the cover is displaced with respect to the test glass plate in the axial direction, and
    the test glass plate is rotated around the axial direction.

6. The test glass changing system as claimed in claim 5, wherein the lift/rotation device has a first annular body for lifting the cover and a second annular body for lifting and rotating the test glass plate.

7. The test glass changing system as claimed in claim 5, wherein the lift/rotation device is arranged in a processing chamber.

8. The test glass changing system as claimed in claim 5, wherein the lift/rotation device is arranged on the rotary disk.

9. The test glass changing system as claimed in claim 1, further including a substrate lock for equipping the rotary disk with substrates.

10. The test glass changing system as claimed in claim 1, further including a substrate lock disposed in a side wall of the coating chamber, the substrate lock being configured to secure the substrate or the test glass holder to the rotary disk.

* * * * *